(12) United States Patent
Na et al.

(10) Patent No.: US 9,349,920 B2
(45) Date of Patent: May 24, 2016

(54) LIGHT EMITTING DEVICE

(71) Applicants: Min Gyu Na, Seoul (KR); Sung Ho Choo, Seoul (KR); Hyun Seoung Ju, Seoul (KR); Gi Seok Hong, Seoul (KR); Ji Hee No, Seoul (KR)

(72) Inventors: Min Gyu Na, Seoul (KR); Sung Ho Choo, Seoul (KR); Hyun Seoung Ju, Seoul (KR); Gi Seok Hong, Seoul (KR); Ji Hee No, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 454 days.

(21) Appl. No.: 13/720,646

(22) Filed: Dec. 19, 2012

(65) Prior Publication Data

US 2013/0161585 A1    Jun. 27, 2013

(30) Foreign Application Priority Data

Dec. 26, 2011 (KR) .......................... 10-2011-0142546

(51) Int. Cl.
*H01L 33/00* (2010.01)
*H01L 33/38* (2010.01)

(52) U.S. Cl.
CPC .............. *H01L 33/387* (2013.01); *H01L 33/382* (2013.01); *H01L 2224/48091* (2013.01); *H01L 2224/49107* (2013.01); *H01L 2224/73265* (2013.01)

(58) Field of Classification Search
CPC ........... H01L 2224/48091; H01L 2924/00014; H01L 2224/49107; H01L 2224/73265; H01L 33/382; H01L 33/387

USPC ...................... 257/98, 99, 79, 100; 438/29, 39
See application file for complete search history.

(56) References Cited

U.S. PATENT DOCUMENTS

| | | | | |
|---|---|---|---|---|
| 7,842,963 | B2* | 11/2010 | Schiaffino et al. | ............... 257/99 |
| 8,309,971 | B2* | 11/2012 | Seo et al. | ......................... 257/79 |
| 8,455,912 | B2* | 6/2013 | Tanaka et al. | ................... 257/99 |
| 8,575,643 | B2* | 11/2013 | Watanabe et al. | ............... 257/99 |
| 2005/0133807 | A1* | 6/2005 | Park et al. | ....................... 257/99 |
| 2006/0192223 | A1* | 8/2006 | Lee et al. | ......................... 257/99 |
| 2009/0179215 | A1* | 7/2009 | Matsui | .................... H01L 33/40 257/98 |
| 2010/0187559 | A1* | 7/2010 | Han | ................................ 257/99 |
| 2012/0326171 | A1* | 12/2012 | Lee et al. | ........................ 257/88 |

FOREIGN PATENT DOCUMENTS

| | | |
|---|---|---|
| JP | 2004-186544 A | 7/2004 |
| WO | WO 2007/081092 A1 | 7/2007 |
| WO | WO 2008/038842 A1 | 4/2008 |
| WO | WO 2009/075551 A2 | 6/2009 |

\* cited by examiner

*Primary Examiner* — Bradley K Smith
*Assistant Examiner* — David Goodwin
(74) *Attorney, Agent, or Firm* — KED & Associates LLP

(57) ABSTRACT

A light emitting device is disclosed. The light emitting device includes a light emitting structure including a first conductive-type semiconductor layer, an active layer, and a second conductive-type semiconductor layer, a light-transmissive conductive layer disposed on the second conductive-type semiconductor layer and having a plurality of open regions through which the second conductive-type semiconductor layer is exposed, and a second electrode disposed on the light-transmissive conductive layer so as to extend beyond at least one of the open regions, wherein the second electrode contacts the second conductive-type semiconductor layer in the open regions and contacts the light-transmissive conductive layer in regions excluding the open regions.

19 Claims, 11 Drawing Sheets

Form through hole by etching

LIGHT EMITTING DEVICE

CROSS REFERENCE TO RELATED APPLICATION

This application claims priority under 35 U.S.C. §119 to Korean Patent Application No. 10-2011-0142546, filed in Korea on Dec. 26, 2011, which is hereby incorporated in its entirety by reference as if fully set forth herein.

TECHNICAL FIELD

Embodiments relate to a light emitting device.

BACKGROUND

Light emitting devices, such as light emitting diodes or laser diodes, using Group III-V or II-VI compound semiconductor materials may produce various colors such as red, green, and blue, and ultraviolet, thanks to development of thin film growth technologies and device materials. In addition, these light emitting devices may produce white light having high efficiency using fluorescent materials or through color mixing and have advantages, such as low power consumption, semi-permanent lifespan, rapid response time, safety, and environmental friendliness, as compared to conventional light sources, such as fluorescent lamps and incandescent lamps.

Therefore, these light emitting devices are increasingly applied to transmission modules of optical communication units, light emitting diode backlight units substituting for cold cathode fluorescence lamps (CCFLs) constituting backlight units of liquid crystal display (LCD) devices, lighting apparatuses using white light emitting diodes substituting for fluorescent lamps or incandescent lamps, headlights for vehicles, and traffic lights.

The light emitting devices emit light having energy determined by the intrinsic energy band of a material of an active layer through combination of electrons injected through a first conductivity-type semiconductor layer and holes injected through a second conductivity-type semiconductor layer. In a light emitting device package, phosphors are excited by light emitted from a light emitting device, and thus, light of a longer wavelength region than light emitted from an active layer may be emitted.

FIG. 1 is a view illustrating a conventional light emitting device 100. FIG. 2 is a view illustrating an electrode structure of the light emitting device 100 of FIG. 1.

Referring to FIG. 1, the light emitting device 100 includes a substrate 110, a buffer layer 115, and a light emitting structure 120 including a first conductive-type semiconductor layer 122, an active layer 124, and a second conductive-type semiconductor layer 126. Here, the buffer layer 115 is interposed between the substrate 110 and the light emitting structure 120.

When the substrate 110 is formed of a non-conductive material, a portion of the first conductive-type semiconductor layer 122 is exposed and a first electrode 150 is disposed on the exposed surface thereof. To uniformly inject holes into the second conductive-type semiconductor layer 126, a light-transmissive conductive layer 130 may be disposed on the second conductive-type semiconductor layer 126, and a second electrode 160 may be disposed on the light-transmissive conductive layer 130.

FIG. 2 illustrates a structure of the first and second electrodes 150 and 160 of the light emitting device 100 of FIG. 1. To uniformly inject electrons and holes into the respective first and second conductive-type semiconductor layers 122 and 126 and to increase the rate of recombination of electrons and holes, as illustrated in FIG. 2, the first electrode 150 includes a first electrode pad 152 and a first branch electrode 154 branching therefrom, and the second electrode 160 includes a second electrode pad 162 and a second branch electrode 164 branching therefrom.

However, conventional light emitting devices have problems as stated below.

Even though the above-described second branch electrode 164 is disposed on the second conductive-type semiconductor layer 126, holes can be concentrated only around a region of the second conductive-type semiconductor layer 126 which corresponds to the second branch electrode 164, and thus, it is difficult to expect binding of electrons and holes in the entire area of the active layer 124.

To address these problems, the light-transmissive conductive layer 130 having a high ability to disperse holes may be disposed on the second conductive-type semiconductor layer 126. However, since the light-transmissive conductive layer 130 has poor contact characteristics with electrode materials, the second electrode 160 and the second branch electrode 164 may not be stably formed.

SUMMARY

In one embodiment, a light emitting device includes: a light emitting structure including a first conductive-type semiconductor layer, an active layer, and a second conductive-type semiconductor layer; a light-transmissive conductive layer disposed on the second conductive-type semiconductor layer and including a plurality of open regions through which the second conductive-type semiconductor layer is exposed; a first electrode connected to the first conductive-type semiconductor layer; and a second electrode disposed on the light-transmissive conductive layer so as to extend beyond at least one of the open regions, wherein the second electrode contacts the second conductive-type semiconductor layer in the open regions and contacts the light-transmissive conductive layer in regions excluding the open regions.

In another embodiment, a light emitting device includes: a light emitting structure including a first conductive-type semiconductor layer, an active layer, and a second conductive-type semiconductor layer; a light-transmissive conductive layer disposed on the second conductive-type semiconductor layer and including a plurality of open regions through which the second conductive-type semiconductor layer is exposed; a first electrode disposed on the light-transmissive conductive layer and being in point contact with the first conductive-type semiconductor layer in a plurality of regions; and a second electrode disposed on the light-transmissive conductive layer and being in point contact with the light-transmissive conductive layer in regions excluding the open regions.

In another embodiment, a light emitting device includes a light emitting structure including a first conductive-type semiconductor layer, an active layer, and a second conductive-type semiconductor layer; a light-transmissive conductive layer disposed on the light emitting structure and having a first pattern including first open portions exposing the light emitting structure and a bridge portion; a second electrode disposed on a region corresponding to an interior of the first pattern and extending in contact with the bridge portion; a light-transmissive insulating layer covering the light-transmissive conductive layer and having a second pattern including a second open portion passing through the light-transmissive conductive layer, the second conductive-type semiconductor layer, and the active layer to expose the first conductive-type semiconductor layer; and a first electrode contacting the first conductive-type semiconductor layer through the second open portion and disposed so as to extend on the light-transmissive insulating layer.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Hereinafter, embodiments will be described with reference to the annexed drawings.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

Figure 1:
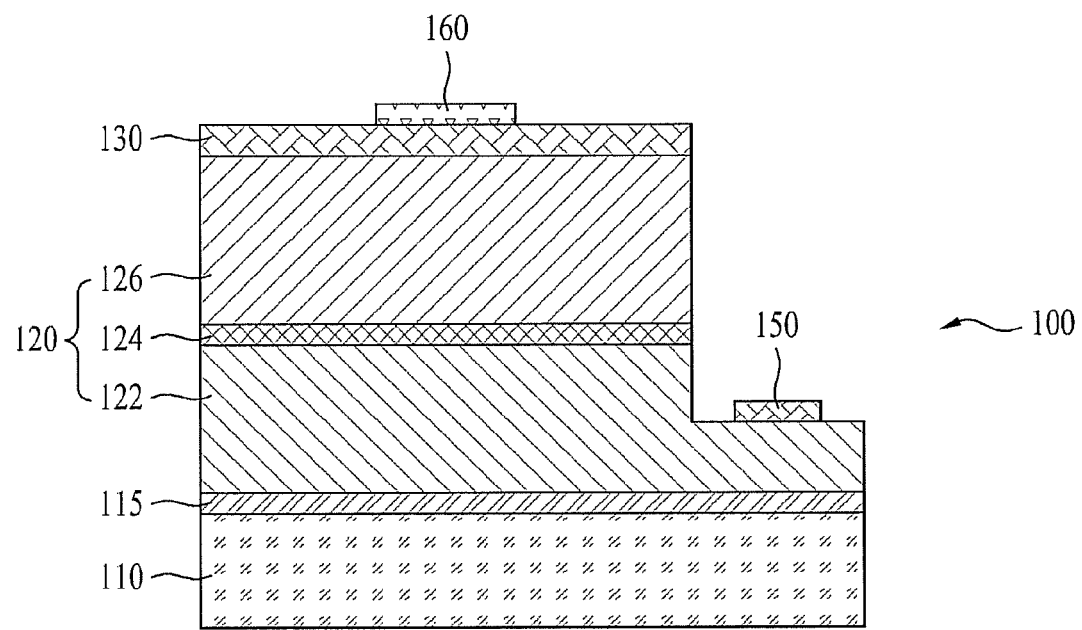
FIG. 1 is a view illustrating a conventional light emitting device.
Figure 2:
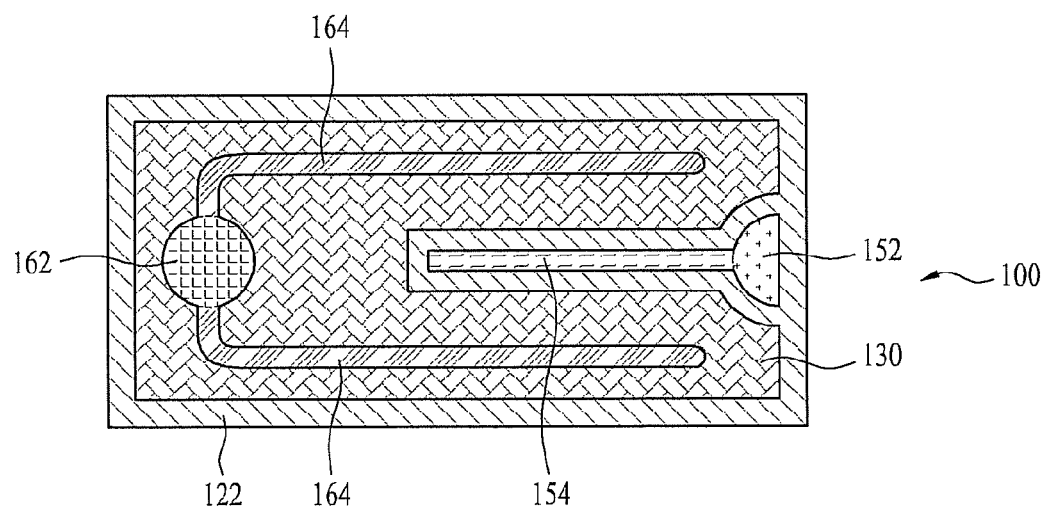
FIG. 2 is a view illustrating an electrode structure of the light emitting device of FIG. 1.
Figure 3:
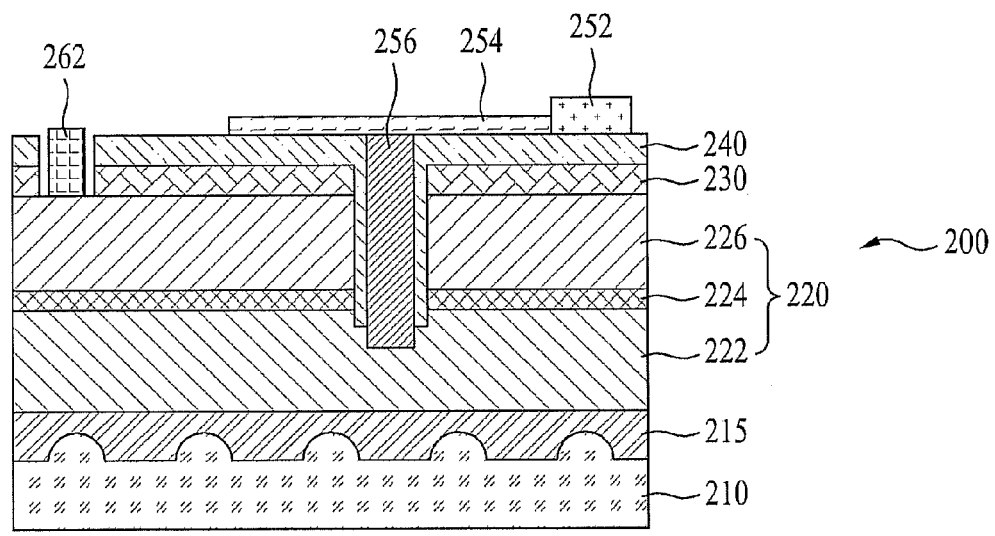
FIG. 3 is a view illustrating a light emitting device according to an embodiment.
Figure 4:
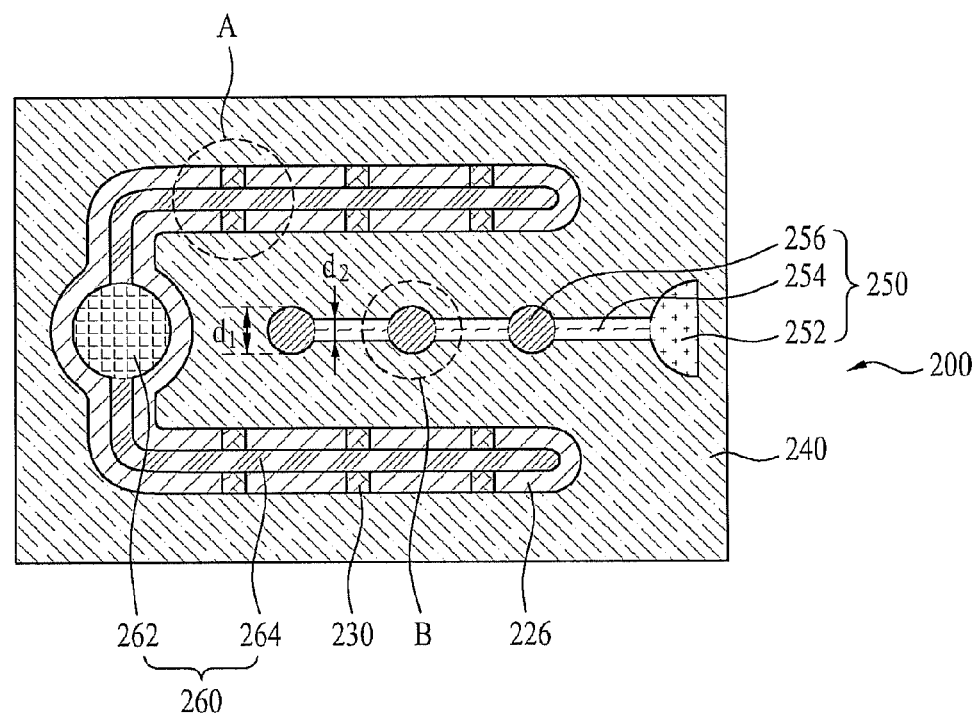
FIG. 4 is a view illustrating an electrode structure of the light emitting device of FIG. 3.

FIG. 3 is a view illustrating a light emitting device 200 according to an embodiment. FIG. 4 is a view illustrating an electrode structure of the light emitting device 200 of FIG. 3.

Referring to FIG. 3, the light emitting device 200 includes a substrate 210, a light emitting structure 220 disposed above the substrate 210 and including a first conductive-type semiconductor layer 222, an active layer 224, and a second conductive-type semiconductor layer 226, a buffer layer 215 interposed between the substrate 210 and the light emitting structure 220, and a light-transmissive conductive layer 230 and a light-transmissive insulating layer 240 that are sequentially disposed on the light emitting structure 220.

A portion of each of the light-transmissive conductive layer 230 and the light-transmissive insulating layer 240 may be patterned to expose the second conductive-type semiconductor layer 226, and a second electrode 260 may be disposed on the exposed surface thereof. In this regard, the second electrode 260 may have a larger height than that of the light-transmissive insulating layer 240, which is easier to wire bond.

A through electrode 256 is disposed at the first conductive-type semiconductor layer 222 to correspond to the second electrode 260, extending through the light-transmissive conductive layer 230, the second conductive-type semiconductor layer 226, and the active layer 224. The light-transmissive insulating layer 240 extends around the through electrode 256, and may prevent the through electrode 256 from being electrically connected to the light-transmissive conductive layer 230, the second conductive-type semiconductor layer 226, or the active layer 224.

The through electrode 256 may be inserted deeper into the first conductive-type semiconductor layer 222 than the light-transmissive insulating layer 240.

The substrate 210 may be formed of a material suitable for growth of semiconductor materials, for example, a carrier wafer. Also, the substrate 210 may be formed of a material having excellent thermal conductivity, and may be a conductive substrate or an insulating substrate. For example, the substrate 210 may be formed of at least one of sapphire ($Al_2O_3$), SiC, Si, GaAs, GaN, ZnO, Si, GaP, InP, Ge, and $Ga_2O_3$. In the present embodiment, the substrate 210 may be an insulating substrate due to the through electrode 256. The substrate 210 has a pattern formed at a surface thereof, and thus, reflection efficiency of light transmitted from the active layer 224 may be increased.

The buffer layer 215 is formed so as to reduce lattice mismatch and difference in coefficients of thermal expansion between materials of the substrate 210 and the first conductive-type semiconductor layer 222. The buffer layer 215 may be formed of at least one of Group III-V semiconductor compounds, e.g., GaN, InN, AlN, InGaN, AlGaN, InAlGaN, and AlInN.

The first conductive-type semiconductor layer 222 may be formed of a semiconductor compound, e.g., a Group III-V or II-VI semiconductor compound, and may be doped with a first conductive-type dopant. When the first conductive-type semiconductor layer 222 is an n-type semiconductor layer, the first conductive-type dopant may be an n-type dopant, for example, Si, Ge, Sn, Se, or Te, but the disclosure is not limited thereto.

The first conductive-type semiconductor layer 222 may include a semiconductor material having a formula of $In_xAl_yGa_{(1-x-y)}N$ where $0 \leq x \leq 1$, $0 \leq y \leq 1$, and $0 \leq x+y \leq 1$. The first conductive-type semiconductor layer 222 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The active layer 224 emits light having energy determined by the intrinsic energy band of a material of the active layer 224, through combination of electrons injected through a first conductivity-type semiconductor layer and holes injected through a second conductivity-type semiconductor layer.

The active layer 224 may have at least one structure of a double hetero junction structure, a single quantum well structure, a multi quantum well (MQW) structure, a quantum-wire structure, and a quantum dot structure. For example, the active layer 224 may have an MQW structure formed through injection of trimethyl gallium gas (TMGa), ammonia gas ($NH_3$), nitrogen gas ($N_2$), and trimethyl indium gas (TMIn), but the disclosure is not limited thereto.

The active layer 224 may have at least one pair structure of a well layer/a barrier layer, e.g., of InGaN/GaN, InGaN/InGaN, GaN/AlGaN, InAlGaN/GaN, InAlGaN/InAlGaN, GaAs(InGaAs)/AlGaAs, and GaP(InGaP)/AlGaP, but the disclosure is not limited thereto. The well layer may be formed of a material having a lower band gap than that of the barrier layer.

A conductive clad layer (not shown) may be formed above and/or below the active layer 224. The conductive clad layer may be formed of a semiconductor having a higher band gap than that of the barrier layer of the active layer 224. For example, the conductive clad layer may include GaN, AlGaN, or InAlGaN or may have a superlattice structure. In addition, the conductive clad layer may be n-type or p-type doped.

The second conductive-type semiconductor layer 226 is disposed on the active layer 224. The second conductive-type semiconductor layer 226 may be formed of a semiconductor compound, for example, of a Group III-V semiconductor compound, a Group II-VI semiconductor compound, or the like, and may be doped with a second conductive-type dopant. For example, the second conductive semiconductor layer 226 may include a semiconductor material having a formula of $In_xAl_yGa_{1-x-y}N$ where $0 \leq x \leq 1$, $0 \leq y \leq 1$, and $0 \leq x+y \leq 1$. When the second conductive-type semiconductor layer 226 is a p-type semiconductor layer, the second conductive-type dopant may be a p-type dopant, such as Mg, Zn, Ca, Sr, or Ba.

The light-transmissive conductive layer 230 may be formed of ITO or the like, and the light-transmissive insulating layer 240 may be formed of $SiO_2$ or $Si_3N_4$.

In the present embodiment, an insulating substrate is used as the substrate 210, and since the through electrode 256 is disposed to supply electrons to the first conductive-type semiconductor layer 222, a portion of the first conductive-type semiconductor layer 222 may not be exposed.

The first electrode 250 may include a first electrode pad 252, a first branch electrode 254, and the through electrode 256, and the second electrode 260 may include a second electrode pad 262 and second branch electrodes 264. The first and second electrodes 250 and 260 may have a single-layered or multi-layered structure of at least one of aluminum (Al), titanium (Ti), chromium (Cr), nickel (Ni), copper (Cu), and gold (Au).

The first electrode 250 supplies current to the first conductive-type semiconductor layer 222. Thus, when the first conductive-type semiconductor layer 222 is an n-type semiconductor layer, the first electrode 250 may supply electrons thereto. The first electrode pad 252 is disposed at an edge region of the light emitting structure 220, and thus, may not deteriorate optical properties of light emitted from the light emitting structure 220.

In the present embodiment, the first electrode pad 252 is disposed on the light-transmissive insulating layer 240, unlike a conventional electrode pad formation method in which an active layer is etched to expose a portion of a first conductive-type semiconductor layer and an electrode pad is formed on the exposed portion of the first conductive-type semiconductor layer. Thus, problems, such as loss of a light emitting region due to etching of the active layer 224 may be addressed.

Since the first electrode pad 252 is disposed on the light-transmissive insulating layer 240, the first electrode pad 252 may be electrically isolated from the light-transmissive conductive layer 230 or the second conductive-type semiconductor layer 226.

The first branch electrode 254 may branch from the first electrode pad 252 and be disposed on the light-transmissive insulating layer 240, and the through electrode 256 may be formed from a predetermined region of the first branch electrode 254. The through electrode 256 may have a size $d_1$ of 5 µm to 10 µm. Herein, the "size" indicates a diameter when the through electrode 256 has a circular cross-section and indicates the length of a side when the through electrode 256 has a polygonal cross-section. The width $d_2$ of the first branch electrode 254 may be 50% of the size $d_1$ of the through electrode 256.

In the present embodiment, the second electrode 260 may be disposed on an open region of the second conductive-type semiconductor layer 226 which is formed by etching the light-transmissive conductive layer 230 and the light-transmissive insulating layer 240. To dispose the second electrode 260, a portion of the light-transmissive insulating layer 240 may be exposed to correspond to the open region of the light-transmissive conductive layer 230. The second electrode 260 may electrically contact the second conductive-type semiconductor layer 226, extending beyond at least one of the open regions and may contact the light-transmissive conductive layer 230 in a region excluding the open regions.

As used herein, the term "open regions" may refer to exposed portions of the second conductive-type semiconductor layer 226 through which a surface thereof is exposed. When the open regions are arranged at a constant interval along the first electrode 250, current may be supplied to the entire area of the light emitting structure 220. In particular, the open regions may be formed at opposite sides of a portion of the first electrode 250, i.e., the first branch electrode 254 and/or the through electrode 256 such that the portion of the first electrode 250 is interposed between the open regions.

The second electrode pad 262 faces the first electrode pad 252 and is formed to correspond to an edge region of the light emitting structure 220, and thus, may supply current to a wide area of the light emitting structure 220 and may not deteriorate optical efficiency.

The first branch electrode 254 branching from the first electrode pad 252 may be disposed to extend towards the second electrode pad 262. The second branch electrodes 264 may branch from the second electrode pad 262 in a second direction. In the present embodiment, the second branch electrodes 264 may be disposed at opposite sides of the first electrode 250, in particular, the first branch electrode 254 such that the first branch electrode 254 is interposed between the second branch electrodes 264.

Figure 5A:
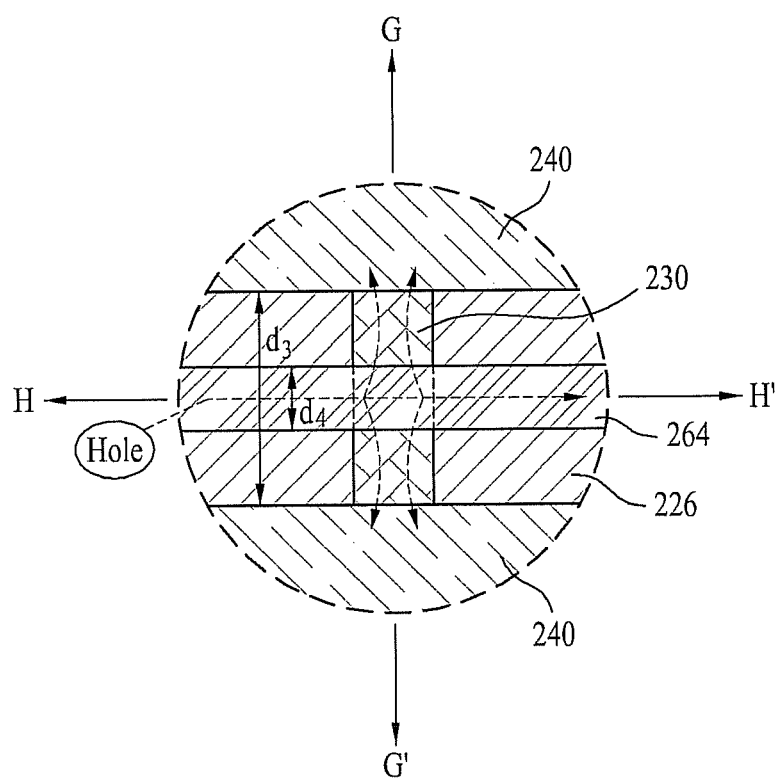
FIGS. 5A through 5C are enlarged views of a region "A" illustrated in FIG. 4.
Figure 5B:
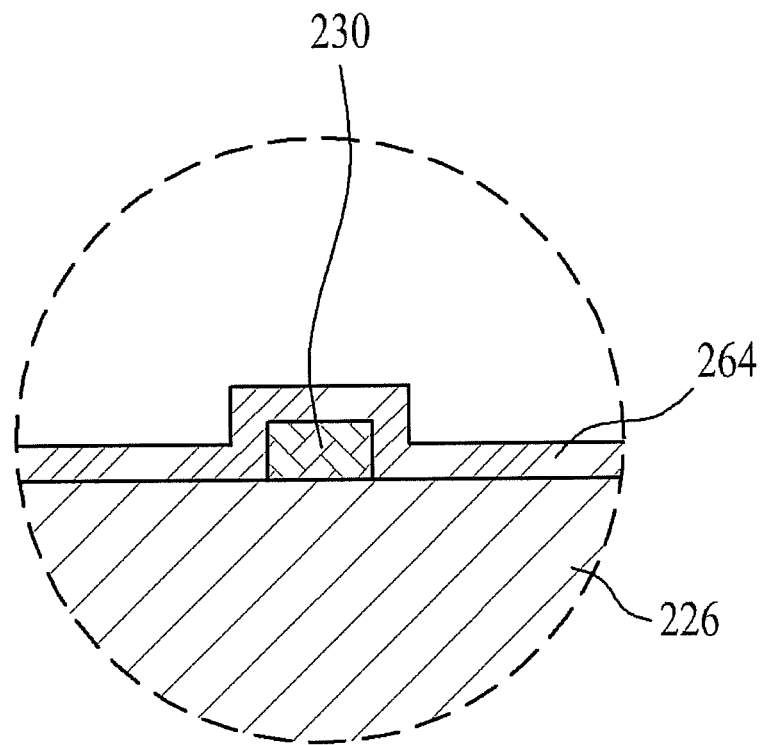
Figure 5C:
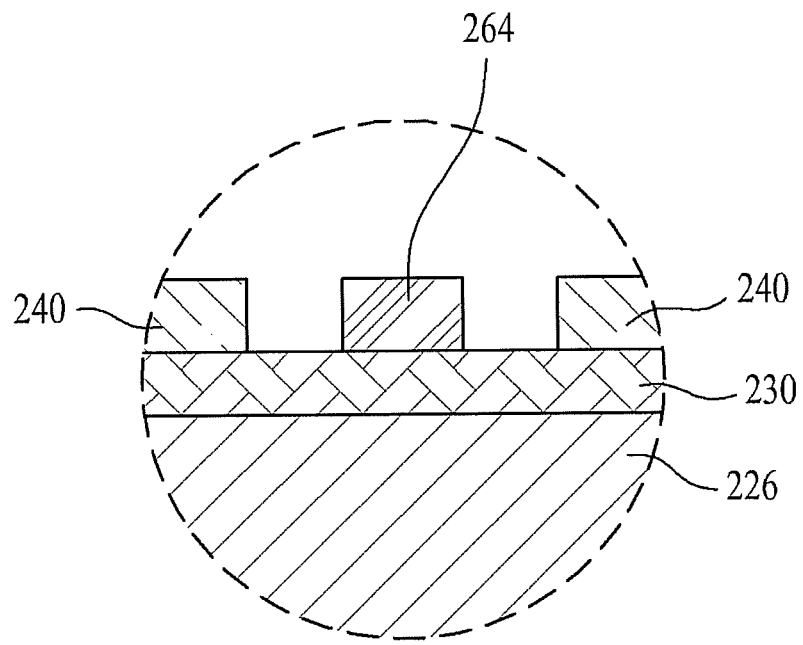
Figure 6:
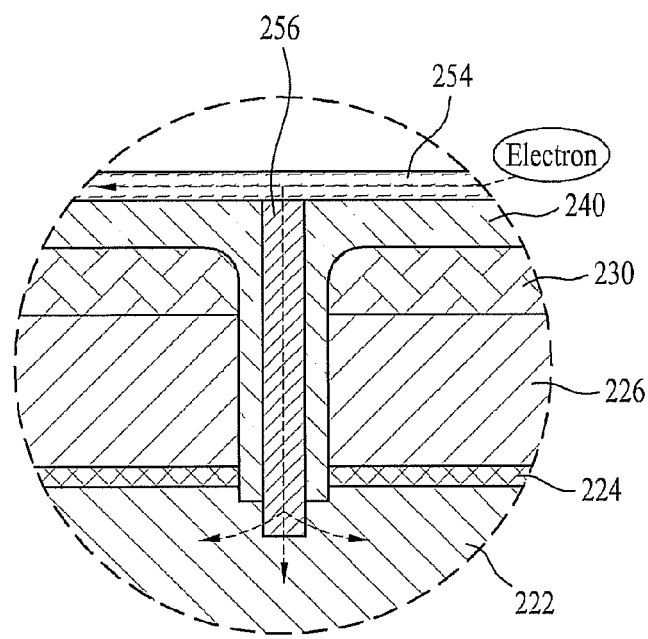
FIG. 6 is an enlarged view of a region "B" illustrated in FIG. 4.
Figure 7A:
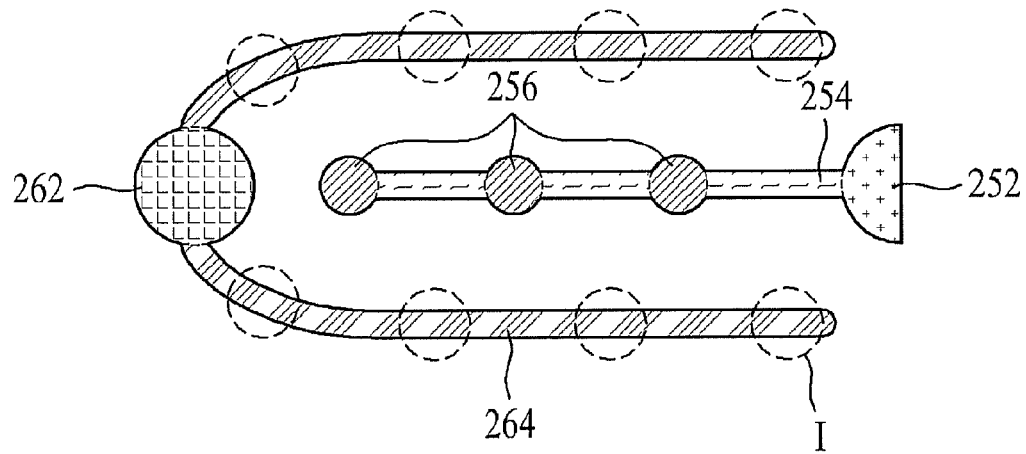
FIG. 7A is a view illustrating a position relationship between first and second electrodes of the light emitting device of FIG. 3.
Figure 7B:
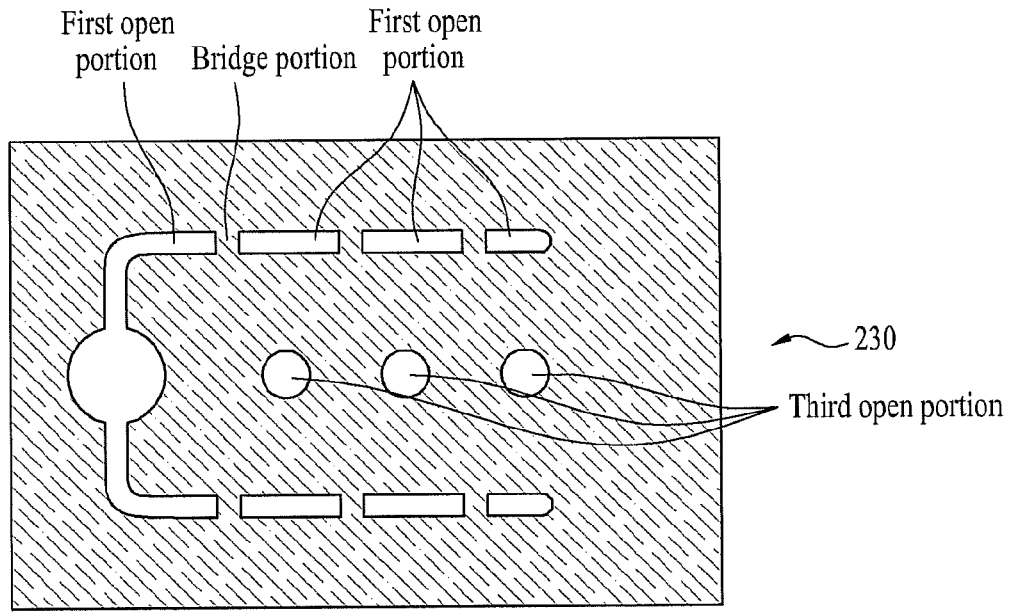
FIG. 7B is a view illustrating a structure of a light-transmissive conductive layer.
Figure 7C:
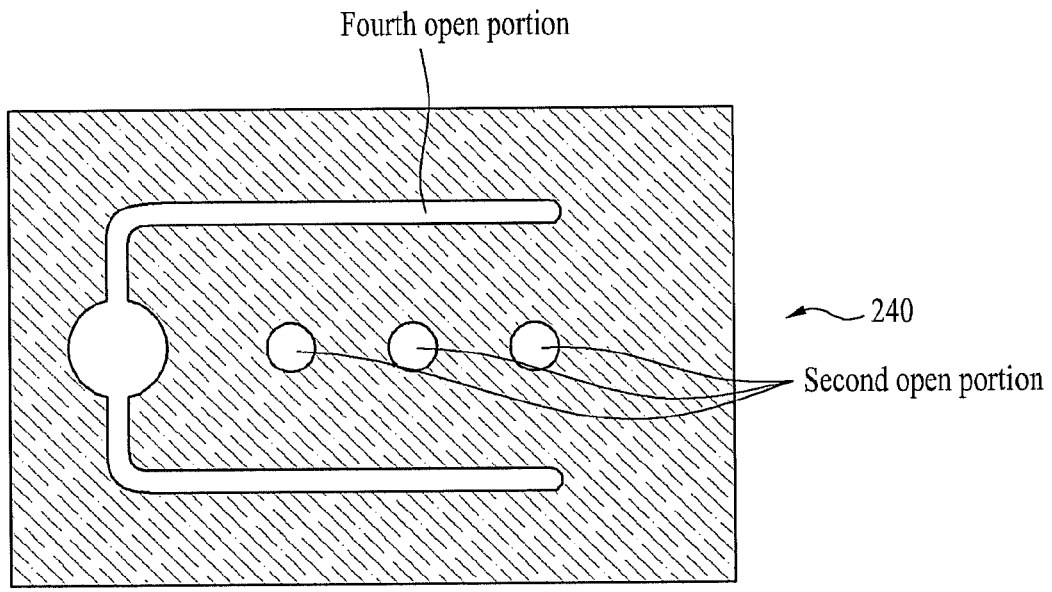
FIG. 7C is a view illustrating a structure of a light-transmissive insulating layer.

FIGS. 5A through 5C are enlarged views of a region "A" illustrated in FIG. 4. FIG. 6 is an enlarged view of a region "B" illustrated in FIG. 4. FIG. 7A is a view illustrating a position relationship between the first and second electrodes of the light emitting device of FIG. 3. FIG. 7B is a view illustrating a structure of a light-transmissive conductive layer. FIG. 7C is a view illustrating a structure of a light-transmissive insulating layer.

In the open region, the second branch electrodes 264 and the second conductive-type semiconductor layer 226 are in direct contact with each other, whereby electrical contact properties may be improved. However, two second branch electrodes are disposed on the second conductive-type semiconductor layer 226 in the form of a curve, and thus, injection of holes may be concentrated only on the second conductive-type semiconductor layer 226 contacting the second branch electrodes 264.

In the present embodiment, the light-transmissive conductive layer 230 is partially disposed in regions excluding the open regions. That is, the light-transmissive conductive layer 230 may be partially disposed in a line shape as illustrated in FIGS. 4 and 5A.

In the regions excluding the open regions, the light-transmissive conductive layer 230 may be disposed between the second conductive-type semiconductor layer 226 and the second branch electrode 264. In addition, at least one region in which the light-transmissive conductive layer 230 is connected between the second conductive-type semiconductor layer 226 and each of the second branch electrodes 264 may be formed. In the illustrated embodiment, three regions for each of the second branch electrodes in which the light-transmissive conductive layer 230 is connected between the second conductive-type semiconductor layer 226 and the second branch electrode 264 are formed.

As illustrated in FIG. 5A, the second branch electrode 264 contacts the second conductive-type semiconductor layer 226, and thus has excellent contact characteristics. In addition, the second branch electrode 264 contacts the light-transmissive conductive layer 230 at a region, and as represented by dotted lines in FIG. 5A, holes may be supplied to the entire area of the second conductive-type semiconductor layer 226 via the light-transmissive conductive layer 230. Here, the second electrode 260 and the light-transmissive conductive layer 230 may be in ohmic contact with each other due to the above-described contact characteristics, and the second electrode 260 may be in Schottky contact with the open regions. The second branch electrode 264 of the second electrode 260 is in point contact with the light-transmissive conductive layer 230. As used herein, the term "point contact" refers to a state in which the second branch electrode 264 does not continuously contact the light-transmissive conductive layer 230 but contacts the light-transmissive conductive layer 230 at regions separated from each other. That is, the second branch electrode 264 contacts the light-transmissive conductive layer 230 having a width as illustrated at a central portion of FIG. 5A.

In FIG. 5A, a width $d_3$ of the open region may be 3 μm to 5 um. When the width $d_3$ of the open region is too small, disposition of the second electrode 260 is not easy. On the other hand, when the width $d_3$ of the open region is too large, the area of the light-transmissive conductive layer 230 decreases, and thus, efficiency of supplying holes to the second conductive-type semiconductor layer 226 may be reduced.

The second branch electrode 264 may have a width $d_4$ of 2 μm to 4 um. When the width $d_4$ of the second branch electrode 264 is too large, an area that blocks and absorbs light emitted from the active layer 224 may increase. On the other hand, when the width $d_4$ of the second branch electrode 264 is too small, it is not easy to form the second branch electrode 264.

FIG. 5B is a cross-sectional view in an H-H' direction of FIG. 5A. As illustrated in FIG. 5A, the light-transmissive conductive layer 230 is disposed on a portion of the second conductive-type semiconductor layer 226, and thus, the second branch electrode 264 has a relatively large height at the region in which the light-transmissive conductive layer 230 is formed.

For a disposition relationship with the first branch electrode 254, which will be described below, at least two regions in which each of the second branch electrodes 264 is connected to the light-transmissive conductive layer 230 may be formed. Considering the contact characteristics of the second branch electrodes 264 and the second conductive-type semiconductor layer 226, an area of the second branch electrode 264 contacting the second conductive-type semiconductor layer 226 may be wider than that of the second branch electrode 264 connected to the light-transmissive conductive layer 230.

In an embodiment, as illustrated in FIG. 4, in regions excluding the open regions, regions in which the light-transmissive conductive layer 230 is connected between one of the second branch electrodes 264 and the second conductive-type semiconductor layer 226 may be formed to correspond to regions in which the light-transmissive conductive layer 230 is connected between the other of the second branch electrodes 264 and the second conductive-type semiconductor layer 226, and this will be described below in connection with disposition of the through electrode 256.

FIG. 5C is a cross-sectional view in a G-G' direction of FIG. 5A. Referring to FIG. 5C, the light-transmissive conductive layer 230 is disposed on the second conductive-type semiconductor layer 226, the second branch electrode 264 is disposed on a central region of the light-transmissive conductive layer 230, and the light-transmissive insulating layer 240 is disposed on an edge region of the light-transmissive conductive layer 230. Here, the light-transmissive conductive layer 230 may be a bridge portion. In FIG. 5C, the highest point of the second branch electrode 264 is formed at the same height as that of the highest point of the light-transmissive insulating layer 240. In some embodiments, however, the highest point of the second branch electrode 264 may be formed higher than that of the light-transmissive insulating layer 240.

FIG. 6 is a view specifically illustrating disposition of the first branch electrode 254 and the through electrode 256. A through hole is formed at a top portion of the light-transmissive insulating layer 240. Here, the through hole is connected to the first conductive-type semiconductor layer 222, extending through the light-transmissive conductive layer 230, the second conductive-type semiconductor layer 226, and the active layer 224.

An electrode material is inserted into the through hole, thereby forming the through electrode 256, and the through electrode 256 is connected to the first branch electrode 254 disposed on the light-transmissive insulating layer 240. The through electrode 256 is inserted deeper into the first conductive-type semiconductor layer 222 than the light-transmissive insulating layer 240, and thus, electrons may be uniformly injected into the first conductive-type semiconductor layer 222. The light-transmissive insulating layer 240 is disposed to extend around the through electrode 256 through the light-transmissive conductive layer 230, the second conductive-type semiconductor layer 226, and the active layer 224, and thus may prevent electrons being injected into the second conductive-type semiconductor layer 226 or the like. That is, the through electrode 256 of the first electrode 250 is in point contact with the first conductive-type semiconductor layer 222.

The above-described open regions may be exposed portions through which a surface of the second conductive-type semiconductor layer 226 is exposed. When the open regions are disposed at a constant interval along the first electrode 250, current may be supplied to the entire area of the light emitting structure 220.

In FIG. 4, a region of the light-transmissive insulating layer 240 through which the light-transmissive conductive layer 230 is exposed may be a first pattern. The first pattern may include first open portions corresponding to the open regions and bridge portions (i.e., the light-transmissive conductive layer 230) disposed between the first open portions. Here, the second electrode 260 may contact the bridge portions within the first pattern.

A region of the light-transmissive insulating layer 240 on which the first electrode 250 is disposed may be a second pattern. The second pattern may include a second open portion in which a through hole is formed from the light-transmissive insulating layer 240 to the first conductive-type semiconductor layer 222 through the light-transmissive conductive layer 230, the second conductive-type semiconductor layer 226, and the active layer 224. In this regard, the first electrode 250 may be electrically connected to the first conductive-type semiconductor layer 222 via the second open portion.

FIG. 7A illustrates a disposition relationship among the first branch electrode 254, the through electrodes 256, and the second branch electrodes 264. The first branch electrode 254 branching from the first electrode pad 252 is disposed in a line shape. In this embodiment, the number of the through electrodes 256 disposed at the first branch electrode 252 is 3. In some embodiments, however, the number of the through electrodes 256 may be at least two.

The second electrode pad 262 faces the first electrode pad 252, and second branch electrodes 264 branching from the second electrode pad 262 are disposed at opposite sides of the first branch electrode 254.

In FIG. 7A, a region represented by 'I' of the second branch electrode 264 is a region in electrical contact with the light-transmissive conductive layer 230. The region represented by 'I', i.e., a region in which the light-transmissive conductive layer 230 is connected between the second branch electrode 264 and the second conductive-type semiconductor layer 226 is disposed not to overlap with the through electrode 256.

In such a configuration, electrons injected into the first conductive-type semiconductor layer 222 and holes injected into the second conductive-type semiconductor layer 226 are injected into an intersection region, and thus, the electrons and the holes may combine uniformly in the entire region of the active layer 224.

In FIG. 7B, first open portions, bridge portions, and third open portions formed at the light-transmissive conductive layer 230 may be referred to as a first pattern. In this regard, the first open portions and the bridge portions may be formed to correspond to the second electrode 260, and the third open portions may correspond to the through electrodes 256.

In FIG. 7C, second open portions and a fourth open portion formed at the light-transmissive insulating layer 240 may be referred to as a second pattern. In this regard, the second open portions may correspond to the through electrodes 256, and the fourth open portion may correspond to the second electrode 260.

FIGS. 8A through 8E are views sequentially illustrating a method for manufacturing a light emitting device, according to an embodiment.

Figure 8A:
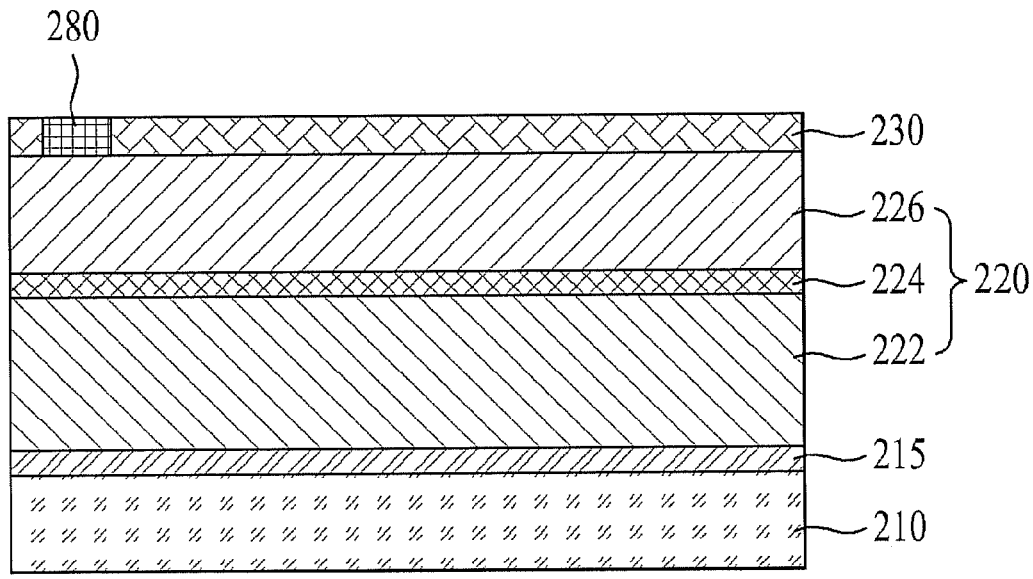
FIGS. 8A through 8E are views sequentially illustrating a method for manufacturing a light emitting device, according to an embodiment.

As illustrated in FIG. 8A, the buffer layer 215, the light emitting structure 220, and the light-transmissive conductive layer 230 are grown on the substrate 210. The substrate 210 may have an uneven portion at an upper surface thereof, but the disclosure is not limited thereto. The substrate 210 may be subjected to wet cleaning to remove impurities on a surface thereof. The composition of the substrate 210 and the buffer layer 215 is the same as described above.

The composition of each of the layers of the light emitting structure 220 is the same as described above, and each layer may be formed by metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), or the like, but the disclosure is not limited thereto.

The light-transmissive conductive layer 230 may be formed by deposition such as sputtering.

The deposition process for forming the light-transmissive conductive layer 230 may be performed in a state in which a mask 280 is disposed on the second conductive-type semiconductor layer 226. In this regard, the region in which the mask 280 is disposed is formed as an open region through which the second conductive-type semiconductor layer 226 is exposed, i.e., a region in which the second electrode 260 is to be formed.

Figure 8B:
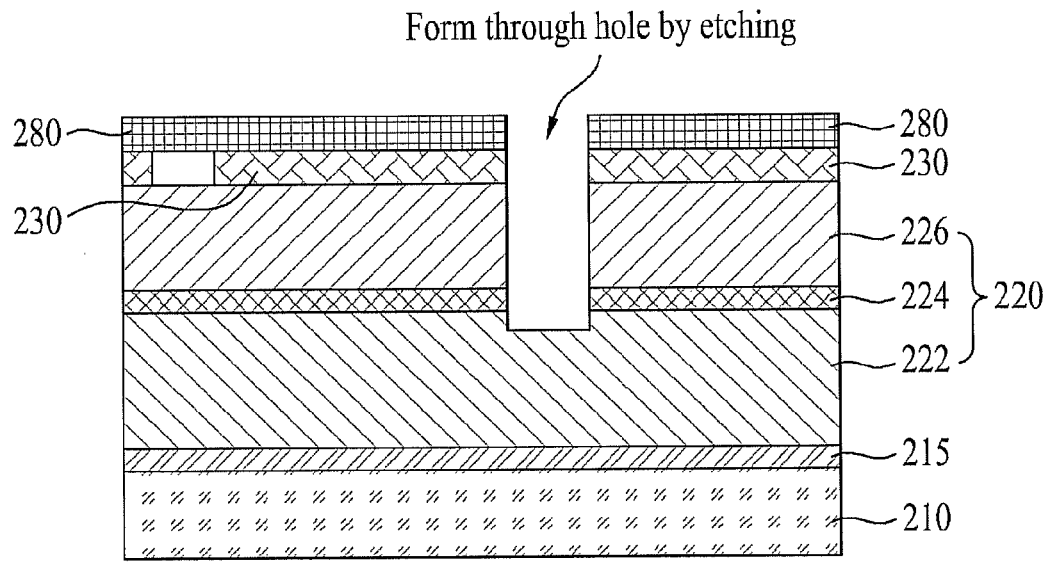

Subsequently, a through hole is formed as illustrated in FIG. 8B. That is, the through hole is formed from an open portion in which the mask 280 is not disposed to a portion of the first conductive-type semiconductor layer 222 through the light-transmissive conductive layer 230, the second conductive-type semiconductor layer 226, and the active layer 224. In FIG. 8B, a single through hole is formed by etching. In some embodiments, however, the number of opening portions formed by the mask 280 may be the same as that of through holes to be formed.

Figure 8C:
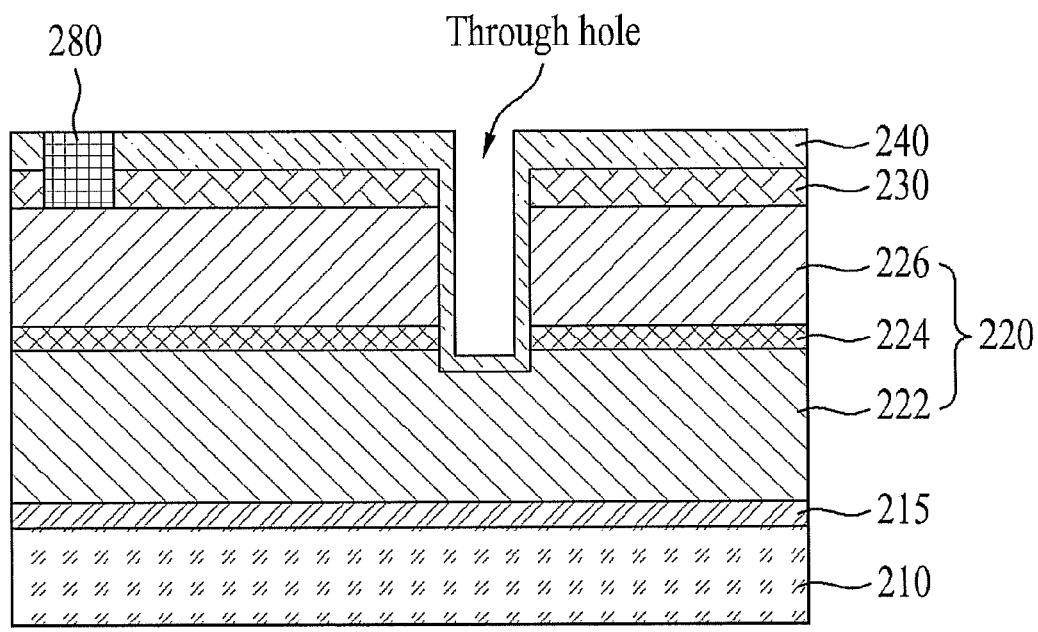
Figure 8D:
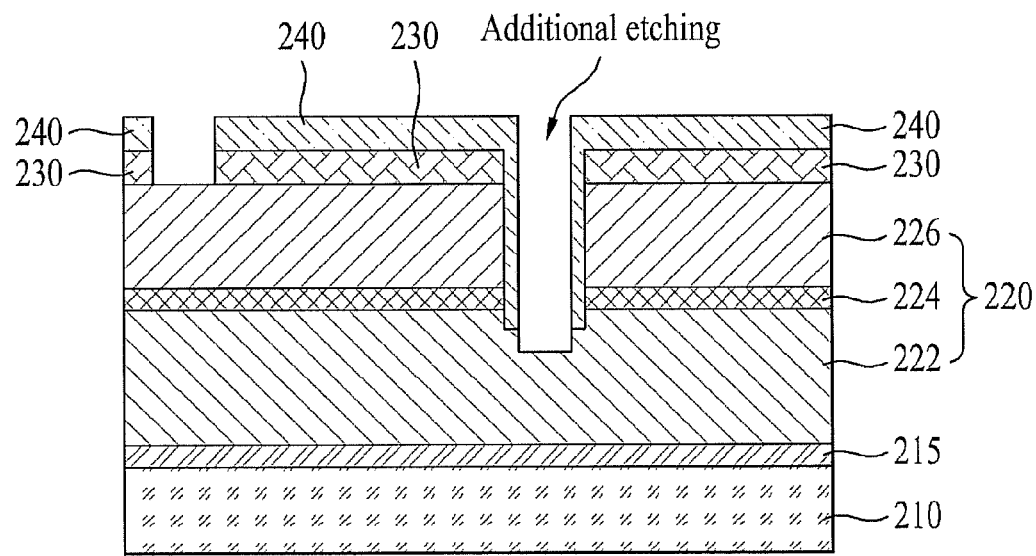

Next, as illustrated in FIG. 8C, the light-transmissive insulating layer 240 may be formed on the light-transmissive conductive layer 230 by deposition such as sputtering. Here, a deposition material may be deposited into the through hole. The mask 280 may be disposed on an open region of the second conductive-type semiconductor layer 226 in which the light-transmissive conductive layer 230 is not disposed, so that the light-transmissive insulating layer 240 is not formed in the open region and the second conductive-type semiconductor layer 226 is exposed.

Figure 8E:
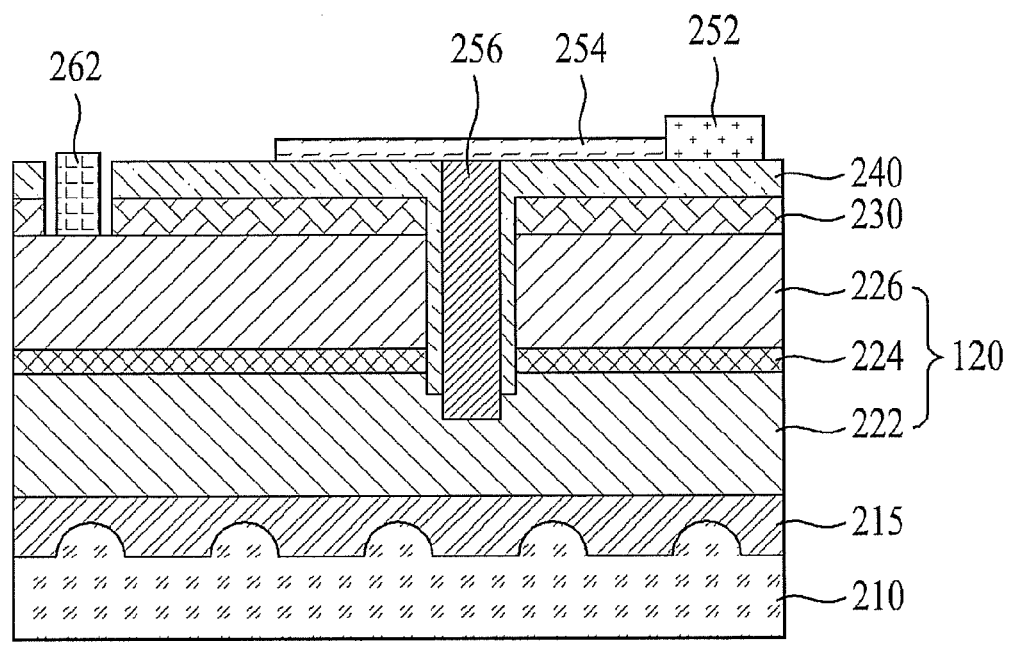

Next, as illustrated in FIG. 8E, an electrode material may be injected into a surface of the light-transmissive insulating layer 240 and the through hole to form the first branch electrode 254 and the through electrode 256. The first electrode pad 252 may be formed so as to contact the first branch electrode 254.

The second electrode pad 262 and the second branch electrodes 264 may be formed on a region in which the second conductive-type semiconductor layer 226 is exposed.

Figure 9:
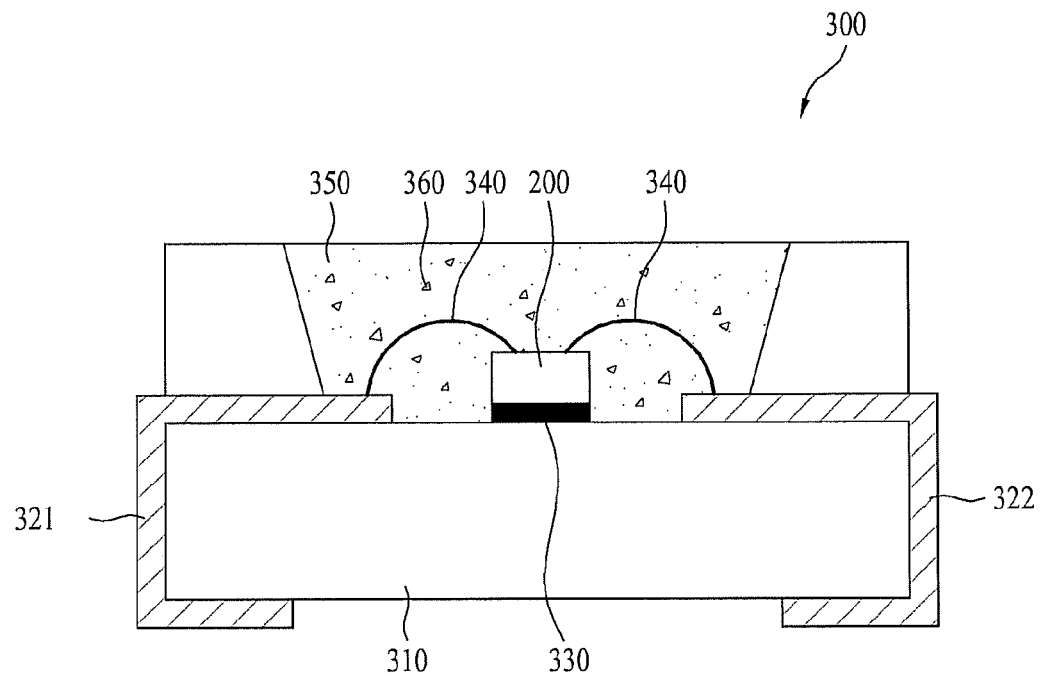
FIG. 9 is a view illustrating a light emitting device package including a light emitting device, according to an embodiment.

FIG. 9 is a view illustrating a light emitting device package 300 including a light emitting device, according to an embodiment.

The light emitting device package 300 includes a package body 310, first and second lead frames 321 and 322 mounted on the package body 310, the above-described light emitting device 200 disposed on the package body 310 and electrically connected to the first and second lead frames 321 and 322, and a molding member 350 covering a top surface and side surfaces of the light emitting device 200.

The package body 310 may be formed of a silicon material, a synthetic resin material, or a metal material. An inclined surface may be formed around the light emitting device 200, thereby increasing light extraction efficiency.

The first lead frame 321 and the second lead frame 322 are electrically isolated from each other and supply power to the light emitting device 200. In addition, the first lead frame 321 and the second lead frame 322 may reflect light generated from the light emitting device 100 to increase light efficiency of the light emitting device package, and may dissipate heat generated from the light emitting device 100 to the outside.

The light emitting device 200 is the light emitting device according to the above-described embodiment and may be disposed on the package body 310. The light emitting device 200 may be bonded with the first and second lead frames 321 and 322 via wires 340 or may be electrically connected thereto using a flip-chip method. In the present embodiment, the light emitting device 200 is fixed on the package body 310 by an adhesion layer 330.

The molding member 350 may surround and protect the light emitting device 200. Also, phosphors 360 may be contained in the molding member 350 to change the wavelength of light emitted from the light emitting device 200.

In the light emitting device 200 included in the light emitting device package 300, a second electrode contacts the second conductive-type semiconductor layer 226 and has excellent contact characteristics. In addition, the second electrode 260 contacts the light-transmissive conductive layer 230 in a region, and thus, holes are supplied to the entire area of the second conductive-type semiconductor layer 226 via the light-transmissive conductive layer 230 and the first electrode formed in a through-hole form does not overlap with the light-transmissive conductive layer 230, and thus, electrons and holes combine in the entire region of the active layer 224, resulting in increased luminous efficiency.

The light emitting device packages 300 may include one or a plurality of the light emitting devices according to the above embodiments, but the disclosure is not limited thereto.

The light emitting device package 300 according to the present embodiment may be arrayed in plural on a substrate, and an optical member including a light guide plate, a prism sheet, a diffusion sheet, and the like may be disposed on an optical path of the light emitting device package 300. The light emitting device package 300, the substrate, and the optical member may function as a light unit. According to another embodiment, a display device, a pointing device, or an illumination system including the light emitting device or the light emitting device package described above may be provided. Examples of the illumination system may include lamps and street lamps. Hereinafter, a head lamp and a backlight unit will be described as embodiments of an illumination system including the above-described light emitting device package.

Figure 10:
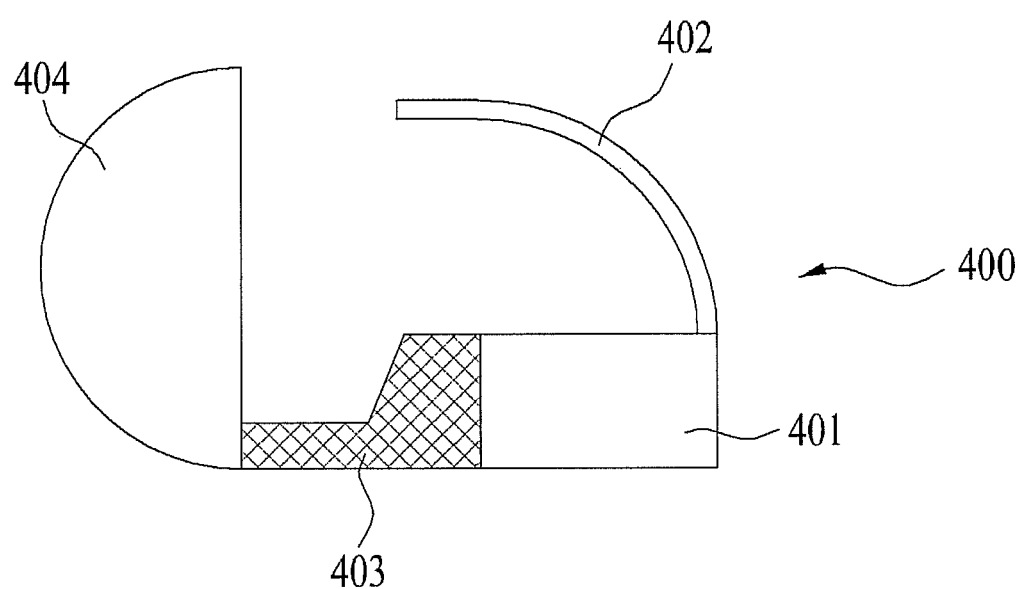
FIG. 10 is a view illustrating a lighting device including a light emitting device package, according to an embodiment.

FIG. 10 is a view illustrating a head lamp 400 including a light emitting device package, according to an embodiment.

In the head lamp 400, light emitted from a light emitting device module 401 including the above-described light emitting device package may be reflected by a reflector 402 and a shade 403, transmit a lens 404, so as to be directed towards a front side of a car.

As described above, in the light emitting device included in the light emitting device module 401, a second electrode contacts a second conductive-type semiconductor layer and thus has excellent contact characteristics. In addition, the second electrode contacts the light-transmissive conductive layer 230 in a region, and thus, holes are supplied to the entire area of the second conductive-type semiconductor layer 226 via the light-transmissive conductive layer 230 and the first electrode formed in a through-hole form does not overlap with the light-transmissive conductive layer 230, and thus, electrons and holes combine in the entire region of the active layer 224, resulting in increased luminous efficiency.

Figure 11:
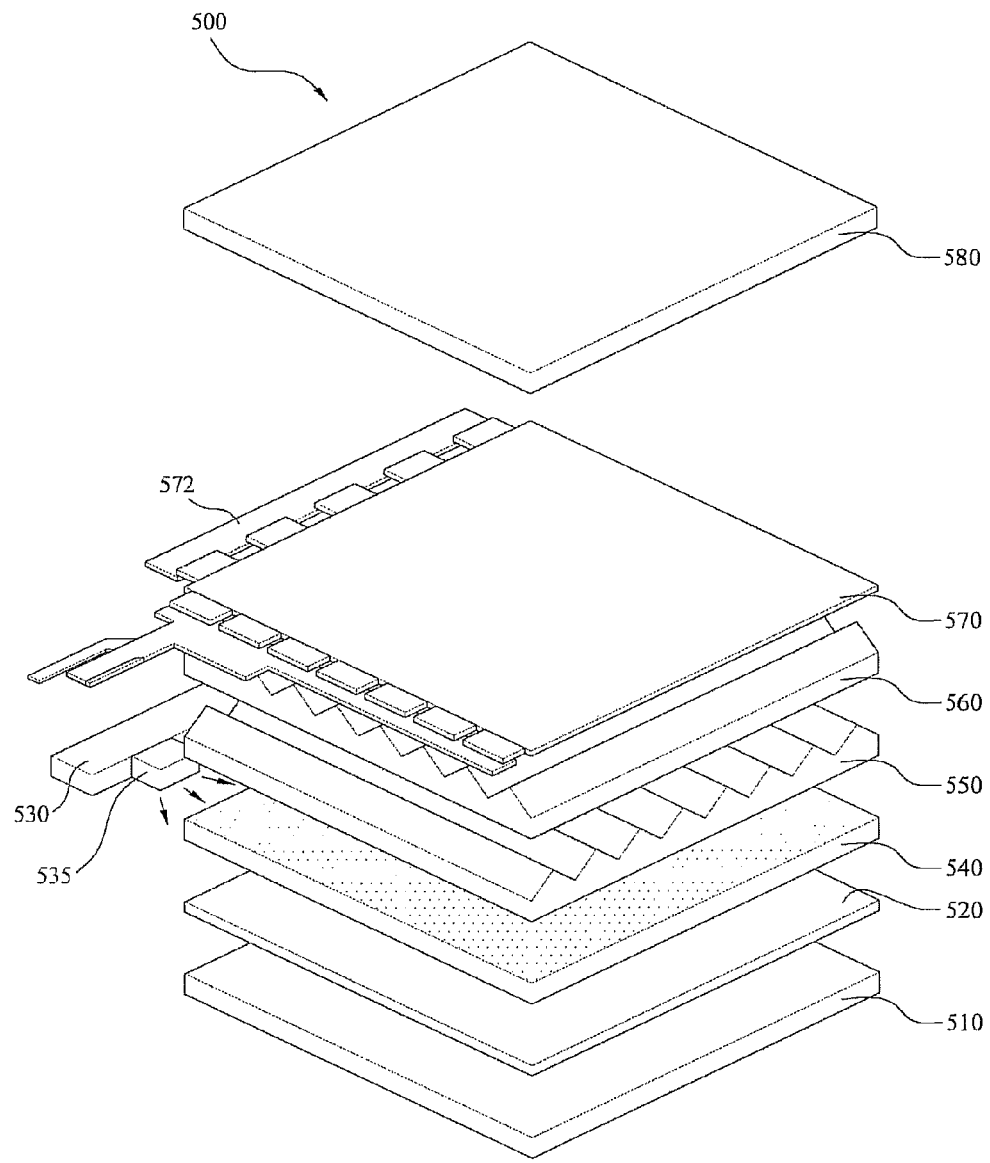
FIG. 11 is a view illustrating an image display device including a light emitting device package, according to an embodiment.

FIG. 11 is a view illustrating an image display device 500 including a light emitting device package, according to an embodiment.

As illustrated in FIG. 11, the display device 500 includes a light source module, a reflective plate 520 on a bottom cover 510, a light guide plate 540 disposed at a front side of the reflective plate 520 to guide light emitted from the light source module to a front side of the display device 500, a first prism sheet 550 and a second prism sheet 560 that are disposed at a front side of the light guide plate 540, a panel 570 at a front side of the second prism sheet 560, and a color filter 580 at a front side of the panel 570.

The light source module includes a light emitting device package 535 on a circuit substrate 530. Here, the circuit substrate 530 may be a printed circuit board (PCB) or the like, and the light emitting device package 535 includes the light emitting device illustrated in FIG. 3.

The bottom cover 510 may accommodate elements of the image display device 500. The reflective plate 520 may be formed as an independent element as illustrated in FIG. 11 or may be provided as a coating formed by coating of a highly reflective material on a rear surface of the light guide plate 540 or a front surface of the bottom cover 510.

The reflective plate 520 may be formed of a material that has a high reflectance and can be used in an ultrathin form, for example, polyethylene terephthalate (PET).

The light guide plate 540 scatters light emitted from the light emitting device and thus enables the emitted light to be uniformly dispersed over the entire region of a screen of a liquid crystal display device. Thus, the light guide plate 540 is formed of a material having a high refractive index and transmittance. For example, the light guide plate 540 may be formed of polymethylmethacrylate (PMMA), polycarbonate (PC), polyethylene (PE), or the like. In addition, when the light guide plate 540 is not formed, an air-guide type display device may be constructed.

The first prism sheet 550 may include a supporting film and a layer of polymer with light transmission and elasticity formed on a surface of the supporting film. The layer of polymer may include a prism layer in which a plurality of three-dimensional structures is repeated. Here, the structure patterns may be formed such that ridges and valleys are repeated in a stripe form as illustrated in FIG. 11.

In the second prism sheet 560, a direction in which ridges and valleys at a surface of a supporting film extend may be perpendicular to a direction in which the ridges and the valleys at the surface of the supporting film of the first prism sheet 550 extend. Such a configuration serves to uniformly disperse light transmitted from the light source module and the reflective plate toward the entire surface of the panel 870.

In the present embodiment, the first and second prism sheets 550 and 560 constitute an optical sheet. Also, the optical sheet may be configured as a micro lens array, a combination of a diffusion sheet and a micro lens array, or a combination of a single prism sheet and a micro lens array.

A liquid crystal display panel may be used as the panel 570. Also, other kinds of display devices that need a light source may be used as the panel 570.

The panel 570 is configured such that liquid crystal is arranged between glass bodies and a polarization plate is mounted on the glass bodies in order to use a polarization property of light. Here, liquid crystals, which have physical properties between liquids and solids, have a structure in which liquid crystal molecules with fluidity are aligned regularly as crystals. In this regard, an image is displayed using a property in which molecular arrangement of the liquid crystal molecules are changed by an external electric field.

The liquid crystal display panel used in the image display device 500 may be of an active matrix type, and uses a transistor as a switch for adjusting a voltage applied to each pixel.

The color filter 580 is disposed on a front surface of the panel 570, and thus, transmits only red, green and blue light by each pixel, of the light transmitted from the panel 570, thereby displaying an image.

In a light emitting device included in the image display device 500 according to the present embodiment, a second electrode contacts a second conductive-type semiconductor layer, and thus has excellent contact characteristics. In addition, the second electrode contacts a light-transmissive conductive layer in a region, and thus, holes are supplied to the entire area of the second conductive-type semiconductor layer via the light-transmissive conductive layer and a first electrode formed in a through-hole form does not overlap with the light-transmissive conductive layer, and thus, electrons and holes combine in the entire region of an active layer, resulting in increased luminous efficiency.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure including a first conductive-type semiconductor layer, an active layer, and a second conductive-type semiconductor layer;
a light-transmissive conductive layer disposed on the second conductive-type semiconductor layer and having a plurality of open regions through which the second conductive-type semiconductor layer is exposed;
a first electrode connected to the first conductive-type semiconductor layer; and
a second electrode disposed on the light-transmissive conductive layer so as to extend beyond at least one of the open regions,
wherein the second electrode contacts the second conductive-type semiconductor layer in the open regions and contacts the light-transmissive conductive layer in regions excluding the open regions, and
wherein the second electrode is in ohmic contact with the light-transmissive conductive layer and is in schottky contact with the second conductive-type semiconductor layer.

2. The light emitting device according to claim 1, wherein at least a portion of the first electrode is interposed between at least a portion of the open regions.

3. The light emitting device according to claim 1, further comprising a light-transmissive insulating layer on the light-transmissive conductive layer, wherein a portion of the first electrode is formed to extend through the light-transmissive conductive layer, the second conductive-type semiconductor layer, and the active layer from the light-transmissive insulating layer so as to be electrically connected to the first conductive-type semiconductor layer.

4. The light emitting device according to claim 3, wherein the light-transmissive insulating layer is exposed to correspond to the open regions of the light-transmissive conductive layer.

5. The light emitting device according to claim 1, wherein the second electrode includes a second electrode pad and at least two second branch electrodes branching from the second electrode pad.

6. The light emitting device according to claim 5, wherein at least one region in which the light-transmissive conductive layer is connected between each of the two second branch electrodes and the second conductive-type semiconductor layer is disposed in regions excluding the open regions.

7. The light emitting device according to claim 6, wherein the at least one region includes at least two regions for each of the two second branch electrodes in which the light-transmissive conductive layer is connected between the second branch electrode and the second conductive-type semiconductor layer are disposed.

8. The light emitting device according to claim 6, wherein an area of the second branch electrode contacting the second conductive-type semiconductor layer is wider than an area of the second branch electrode connected to the light-transmissive conductive layer.

9. The light emitting device according to claim 6, wherein the second branch electrode has a larger height in a connection region with the light-transmissive conductive layer than a height of the second branch electrode in a region contacting the second conductive-type semiconductor layer.

10. The light emitting device according to claim 6, wherein regions in which the light-transmissive conductive layer is connected to one of the second branch electrodes correspond to regions in which the light-transmissive conductive layer is connected to another one of the second branch electrodes.

11. The light emitting device according to claim 10, wherein the first electrode includes a first electrode pad and a first branch electrode branching from the first electrode pad and interposed between the two second branch electrodes.

12. The light emitting device according to claim 10, wherein the first electrode includes at least one through electrode in electrical contact with the first conductive-type semiconductor layer, the through electrode being formed to extend through the light-transmissive insulating layer, the light-transmissive conductive layer, the second conductive-type semiconductor layer, and the active layer.

13. The light emitting device according to claim 12, wherein the at least one region formed in a region excluding the open regions does not overlap with the through electrode.

14. The light emitting device according to claim 6, wherein a height of the highest point of the second electrode pad is larger than a height of a surface of the light-transmissive insulating layer.

15. The light emitting device according to claim 1, wherein the first electrode is in point contact with the first conductive-type semiconductor layer in a plurality of regions, the second electrode is in point contact with the light-transmissive conductive layer in regions excluding the plurality of open regions, and point contacting regions of the first conductive-type semiconductor layer and point contacting regions of the light-transmissive conductive layer are alternatively disposed.

16. The light emitting device according to claim 15, further comprising a light-transmissive insulating layer on the light-transmissive conductive layer, wherein a portion of the first electrode is formed to extend through the light-transmissive conductive layer, the second conductive-type semiconductor layer, and the active layer from the light-transmissive insulating layer so as to be electrically connected to the first conductive-type semiconductor layer.

17. The light emitting device according to claim 16, wherein the light-transmissive insulating layer is exposed to correspond to the open regions of the light-transmissive conductive layer.

18. The light emitting device according to claim 15, wherein the first electrode includes a first electrode pad and a first branch electrode branching from the first electrode pad, the second electrode includes a second electrode pad and at least two second branch electrodes branching from the second electrode pad, and the first branch electrode is interposed between the two second branch electrodes.

19. A light emitting device comprising:
- a light emitting structure including a first conductive-type semiconductor layer, an active layer, and a second conductive-type semiconductor layer;
- a light-transmissive conductive layer disposed on the light emitting structure and having a first pattern comprising first open portions through which the light emitting structure is exposed and a bridge portion;
- a light-transmissive insulating layer covering the light-transmissive conductive layer and having a second pattern including a second open portion formed to extend through the light-transmissive conductive layer, the second conductive-type semiconductor layer and the active layer so as to expose the first conductive-type semiconductor layer;
- a first electrode contacting the first conductive-type semiconductor layer through the second open portion and disposed so as to extend on the light-transmissive insulating layer; and
- a second electrode disposed on a region corresponding to an interior of the first pattern and extending to contact the bridge portion,
- wherein the light-transmissive conductive layer is disposed between the light-transmissive insulating layer and the second conductive-type semiconductor layer; and
- wherein the second electrode is in ohmic contact with the light-transmissive conductive layer and is in schottky contact with the second conductive-type semiconductor layer.

\* \* \* \* \*